US009747058B2

(12) United States Patent
Oh et al.

(10) Patent No.: US 9,747,058 B2
(45) Date of Patent: Aug. 29, 2017

(54) SEMICONDUCTOR MEMORY DEVICE, MEMORY SYSTEM INCLUDING THE SAME, AND METHOD OF OPERATING THE SAME

(71) Applicant: Samsung Electronics Co., Ltd., Suwon-si (KR)

(72) Inventors: Gi-Won Oh, Seoul (KR); Ju-Yun Jung, Hwaseong-si (KR); Soo-Hyeong Kim, Hwaseong-si (KR); Hyun-Joong Kim, Yongin-si (KR)

(73) Assignee: SAMSUNG ELECTRONICS CO., LTD., Sansung-ro, Yeongtong-gu, Suwon-si, Gyeonggi-do (KR)

( * ) Notice: Subject to any disclaimer, the term of this patent is extended or adjusted under 35 U.S.C. 154(b) by 79 days.

(21) Appl. No.: 14/730,632

(22) Filed: Jun. 4, 2015

(65) Prior Publication Data
US 2016/0034371 A1 Feb. 4, 2016

(30) Foreign Application Priority Data
Jul. 30, 2014 (KR) .................. 10-2014-0097522

(51) Int. Cl.
*G11C 29/00* (2006.01)
*G06F 3/06* (2006.01)
*G11C 5/02* (2006.01)
*G11C 7/10* (2006.01)
*G11C 8/00* (2006.01)
*G11C 5/04* (2006.01)

(52) U.S. Cl.
CPC .......... *G06F 3/0688* (2013.01); *G06F 3/0619* (2013.01); *G06F 3/0635* (2013.01); *G06F 3/0659* (2013.01); *G11C 5/02* (2013.01); *G11C 7/1012* (2013.01); *G11C 8/00* (2013.01); *G11C 29/76* (2013.01); *G11C 5/04* (2013.01); *G11C 2207/108* (2013.01)

(58) Field of Classification Search
CPC ...... G06F 11/104; G06F 11/201; G06F 17/50; G06F 17/5036; G06F 17/5068; G06F 3/0619; G06F 3/0635; G06F 3/0659; G06F 3/0688; G06F 11/2094; G11C 29/883; G11C 29/808; G11C 2207/108
See application file for complete search history.

(56) References Cited

U.S. PATENT DOCUMENTS 5,805,512 A 9/1998 Nakai et al.
7,539,800 B2 5/2009 Dell et al.
(Continued)

FOREIGN PATENT DOCUMENTS

JP 07-312096 11/1995
JP 2005-310246 11/2005
(Continued)

*Primary Examiner* — David Ton
(74) *Attorney, Agent, or Firm* — Muir Patent Law, PLLC

(57) ABSTRACT

A semiconductor memory device includes a memory cell array including a plurality of cell cores which include a first cell core corresponding to a first channel that is a normal channel and a second cell core corresponding to a second channel that is a failed channel; and an access circuit configured to perform address remapping by converting a first address of at least a first failed cell in the first cell core into a second address of at least a second cell in the second cell core, and to transmit data of at least the second cell through the first channel.

20 Claims, 16 Drawing Sheets

(56) References Cited

U.S. PATENT DOCUMENTS

| | | |
|---|---|---|
| 8,644,072 B2 | 2/2014 | Nagashima |
| 2003/0037278 A1* | 2/2003 | Olarig .................. G11C 29/76 |
| | | 714/5.1 |
| 2005/0013311 A1* | 1/2005 | Samudrala ............ H04L 49/101 |
| | | 370/412 |
| 2011/0298011 A1 | 12/2011 | Lee et al. |
| 2013/0329510 A1 | 12/2013 | Keeth et al. |
| 2014/0039863 A1 | 2/2014 | Brown |

FOREIGN PATENT DOCUMENTS

| | | |
|---|---|---|
| KR | 10-2003-0029396 A | 4/2003 |
| KR | 10-2004-0097458 A | 11/2004 |
| KR | 10-2007-0072228 A | 7/2007 |
| KR | 10-2011-0075348 A | 7/2011 |

* cited by examiner

SEMICONDUCTOR MEMORY DEVICE, MEMORY SYSTEM INCLUDING THE SAME, AND METHOD OF OPERATING THE SAME

CROSS-REFERENCE TO RELATED APPLICATIONS

This application claims priority under 35 U.S.C. §119(a) to Korean Patent Application No. 10-2014-0097522 filed on Jul. 30, 2014, the disclosure of which is hereby incorporated by reference in its entirety.

BACKGROUND

Embodiments of the present disclosure relate to a semiconductor memory device, a memory system including the same, and a method of operating the same, and more particularly, to a semiconductor memory device for reducing the waste of memory space, a memory system including the same, and a method of operating the same.

A semiconductor memory device includes a plurality of memory cells that store data, and communicates a command and the data with an external system, e.g., a memory controller. The data can be transferred to the external system through channels corresponding to the memory cells. However, when a certain channel among the channels cannot be used, memory cells corresponding to the channel cannot be used either. This may lead to the waste of memory space in the semiconductor memory device, reducing an efficiency of the semiconductor memory device.

SUMMARY

According to some embodiments of the inventive concept, there is provided a semiconductor memory device including a memory cell array including a plurality of cell cores which include a first cell core corresponding to a first channel that is a normal channel and a second cell core corresponding to a second channel that is a failed channel; and an access circuit configured to perform address remapping by converting a first address of at least a first failed cell in the first cell core into a second address of at least a second cell in the second cell core, and to transmit data of at least the second cell through the first channel.

The access circuit may include an address remapper configured to perform the address remapping; and a channel multiplexer configured to transmit read data from at least the second cell to the first channel, and to transmit write data to at least the second cell through the first channel.

The semiconductor memory device may be configured such that: when transferring the read data and the write data for at least the second cell, the channel multiplexer may connect a second data line corresponding to the second cell core to the first channel.

The access circuit may further include a control circuit configured to control the address remapper based on a failed-cell command corresponding to information about the first address of at least the first failed cell, and to control the channel multiplexer based on a failed-channel command corresponding to information about the failed channel.

The failed-cell command and the failed-channel command may be generated by a memory controller in a test mode of the semiconductor memory device.

The access circuit may further include a data input/output circuit configured to detect a command and address information received from a memory controller according to control of the control circuit and to transmit the read data and the write data; a write driver and sense amplifier block configured to transmit the write data to the memory cell array, and sense the read data from the memory cell array, respectively; a row decoder and row driver configured to select a first word line of a plurality of word lines based on address information resulting from the address remapping; and a column decoder and column driver configured to connect a first bit line of a plurality of bit lines to the write driver and sense amplifier block based on the address information resulting from the address remapping.

At least one cell core of the plurality of cell cores may be disposed in a first cell die of a plurality of cell dies overlapping each other in a stack structure and the plurality of cell cores may be electrically connected to each other through through-substrate vias.

The memory cells included in the memory cell array may be dynamic random access memory (DRAM) cells.

The semiconductor memory device may be configured such that: when the access circuit receives a read command for the at least one failed cell, the address remapper may convert the first address of at least the first failed cell into the second address of at least the second cell, and the channel multiplexer may receive the read data from at least the second cell through a second data line corresponding to the second cell core and transmit the read data to the first channel.

The semiconductor memory device may be configured such that: when the access circuit receives a write command for at least the first failed cell, the address remapper may convert the first address of at least the first failed cell into the second address of at least the second cell, and the channel multiplexer may receive the write data to be written to at least the second cell through the first channel and transmit the write data to the second data line corresponding to the second cell core.

According to other embodiments of the inventive concept, there is provided a memory system including a semiconductor memory device and a memory controller configured to control the semiconductor memory device through a plurality of channels connected to the semiconductor memory device. The semiconductor memory device includes a memory cell array including a plurality of cell cores which include a first cell core corresponding to a first channel of the plurality of channels and a second cell core corresponding to a second channel of the plurality of channels that is a failed channel of the plurality of channels; and an access circuit configured to perform address remapping by converting a first address of at least a first failed cell in the first cell core into a second address of at least a second cell in the second cell core, and to transmit data from/to at least the second cell through the first channel.

The first channel may be connected to a first memory chip and the second channel may be connected to a second memory chip. The first and second memory chips may be stacked on each other and connected through through-substrate vias (TSVs).

The memory system may be configured such that: when transferring the read data and the write data for at least the second cell, the channel multiplexer may connect a second data line corresponding to the second cell core to the first channel.

The memory controller may be configured to generate the failed-cell command and the failed-channel command in a test mode of the semiconductor memory device.

The memory system may be configured such that: when the access circuit receives a read command for the at least one failed cell, the address remapper may convert the address of the at least one failed cell into the address of the at least one redundant cell and the channel multiplexer may receive the read data from the at least one redundant cell through a second data line corresponding to the second cell core and transmit the read data to the first channel.

The memory system may be configured such that: when the access circuit receives a write command for at least the first failed cell, the address remapper may convert the first address of at least the first failed cell into the second address of at least the second cell, and the channel multiplexer may receive the write data to be written to at least the second cell through the first channel and transmit the write data to the second data line corresponding to the second cell core.

According to further embodiments of the inventive concept, there is provided a method of operating a semiconductor memory device including a first set of sub-arrays, each sub-array having a plurality of memory cells. The method includes detecting a second failed channel of a plurality of channels and a first failed cell of a first sub-array of the first set of sub-arrays; converting a first address of the first failed cell into a second address of a second cell of a second sub-array of the first set of sub-arrays corresponding to the second failed channel when the first failed cell is requested; and transmitting data of the second cell through the first channel corresponding to the first sub-array including the first failed cell.

The method may further include connecting a first data line corresponding to the second cell to the first channel.

The detecting the second failed channel and the first failed cell may be performed by a memory controller that controls the semiconductor memory device.

According to example embodiments of the inventive concept, there is provided a semiconductor memory device. The semiconductor memory device may include a plurality of channels; a memory cell array; and a first circuit. The memory cell array may include a first set of sub-arrays, wherein a respective sub-array of the first set of sub-arrays may include a plurality of memory cells and the respective sub-array corresponds to a respective channel of the plurality of channels. The first circuit may be configured to select a second address corresponding to at least a second memory cell of at least a second sub-array of the first set of sub-arrays when receiving a first address corresponding to at least a first memory cell of at least a first sub-array of the first set of sub-arrays, and to output data of at least the second memory cell through a first channel corresponding to at least the first sub-array. The first address may be determined based on a corresponding failed cell of the first set of sub-arrays. The second address may be determined based on a corresponding failed channel of the plurality of channels.

According to example embodiments of the inventive concept, there is provided a method of operating a semiconductor memory device connected to a plurality of channels and including a first set of sub-arrays, each respective sub-array having a plurality of memory cells and corresponding to a respective channel. The method may include: selecting a second address corresponding to at least a second memory cell of a second sub-array of the first set of sub-arrays when receiving a first address corresponding to at least a first memory cell of at least a first sub-array of the first set of sub-arrays; and outputting data of at least the second memory cell through a first channel of the plurality of channels corresponding to at least the first sub-array. The first address may be determined based on a corresponding failed cell of the first set of sub-arrays. The second address may be determined based on a corresponding failed channel of the plurality of channels

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS

Figure 1:
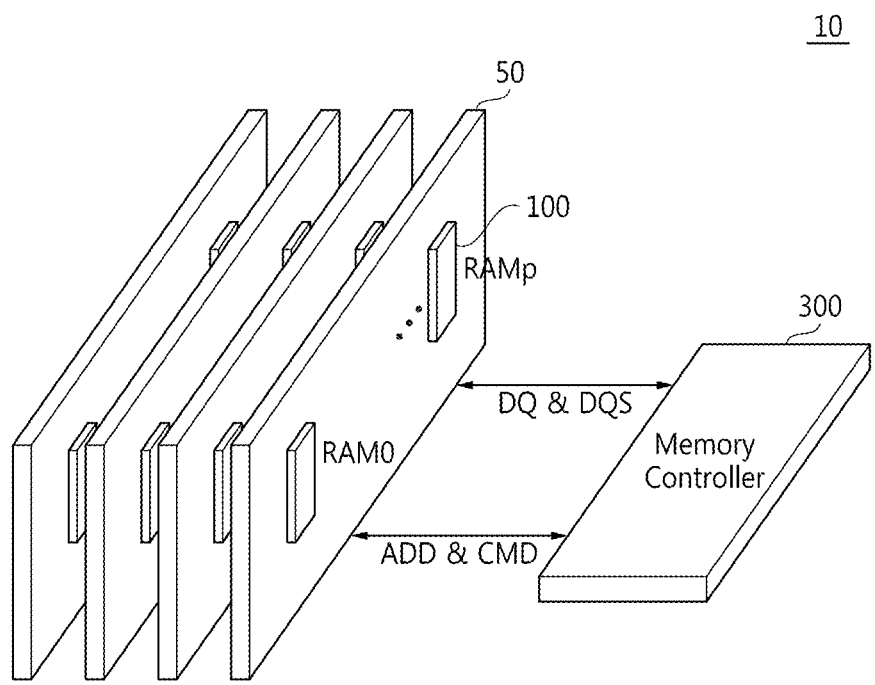
FIG. 1 is a schematic diagram of a memory system according to some embodiments of the inventive concept.

The present disclosure now will be described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first signal could be termed a second signal, and, similarly, a second signal could be termed a first signal without departing from the teachings of the disclosure. The terms "first", "second", etc. may be used in the claims as a naming convention, for example, to label elements which may or may not be described in the specification using the same naming scheme.

The terminology used herein is for the purpose of describing particular embodiments only and is not intended to be limiting of the invention. As used herein, the singular forms "a", "an" and "the" are intended to include the plural forms as well, unless the context clearly indicates otherwise. Expressions such as "at least one of," when preceding a list of elements, modify the entire list of elements and do not modify the individual elements of the list. It will be further understood that the terms "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless the context indicates otherwise, terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic diagram of a memory system 10 according to some embodiments of the inventive concept. The memory system 10 may include a memory module 50 and a memory controller 300.

The memory module 50 may be an electronic device that includes a plurality of dies (hereinafter, a die may be referred as a chip) RAM0 through RAMp each corresponding to a semiconductor memory device. The memory module 50 may be implemented as a single in-line memory module (SIMM) or a dual in-line memory module (DIMM). Each of the dies RAM0 through RAMp may operate in response address information ADD and a command CMD from the memory controller 300 and may communicate a data signal DQ and a data strobe signal DQS with the memory controller 300.

As used herein, a semiconductor device may refer to various items such as a memory device, one or more logic devices or memory cells formed in or on a semiconductor substrate, a semiconductor chip, a memory chip, a memory die, a logic chip, a package, or combinations thereof. A semiconductor device such as a semiconductor chip, a memory chip, a memory die, or a logic chip may be formed from a wafer. A semiconductor device may comprise a package which may include one or more chips stacked on a package substrate, or a package-on-package device including a plurality of packages. A semiconductor memory device refers to a semiconductor device that includes one or more memory array, such as a semiconductor memory chip (e.g., volatile or non-volatile memory).

An electronic device, as used herein, may refer to one of these devices and may also include products that include these devices, such as a memory card, a memory module, a hard drive including additional components, a mobile phone, laptop, tablet, desktop, camera, server, computing system, memory system, or other consumer electronic device, etc.

The memory controller 300 may control the overall operation, such as a read, write or refresh operation, of the memory module 50. The memory controller 300 may be implemented as a part of a system on chip (SoC).

Figure 2:
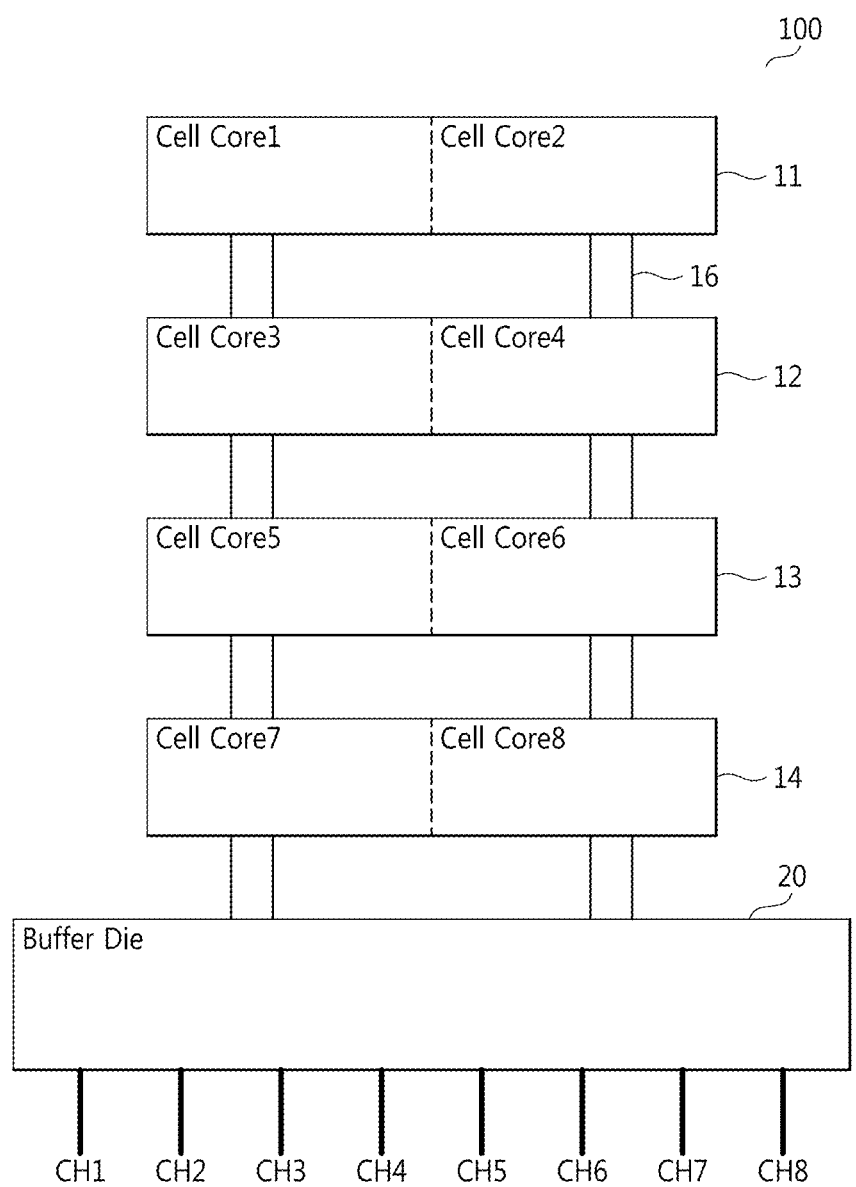
FIG. 2 is a block diagram of one of a plurality of dies illustrated in FIG. 1 according to example embodiments.

FIG. 2 is a block diagram of one of the dies RAM0 through RAMp illustrated in FIG. 1 according to example embodiments. Referring to FIGS. 1 and 2, a semiconductor memory device 100 is one of the dies RAM0 through RAMp. The semiconductor memory device 100 may include first through fourth cell dies 11 through 14 and a buffer die 20.

Each of the cell dies 11 through 14 may include at least one cell core including a plurality of memory cells. In the embodiments illustrated in FIG. 2, the semiconductor memory device 100 includes four cell dies 11 through 14, each of the cell dies 11 through 14 includes two cell cores, and the semiconductor memory device 100 includes a total of eight cell cores Cell Core1 through Cell Core8. However, the number of cell dies, the number of cell cores, and the number of memory cells included in each cell core may be changed; and the inventive concept is not restricted to the present embodiments. In one embodiment, each of the cell dies 11 through 14 may include the same type of memory cell, for example, a dynamic random access memory (DRAM), a static random access memory (SRAM), a NAND flash memory, a NOR flash memory, a phase random access memory (PRAM), a ferroelectric random access memory (FRAM), a resistive random access memory (RRAM), a magnetic random access memory (MRAM), etc. In another embodiment, at least one of the cell dies 11 through 14 may include a different type of memory cell from others, for example, the first cell die 11 may comprise a type of the DRAM, the second cell die 12 may comprise a type of the SRAM, the third cell die 13 may comprise a type of the NAND flash memory, the fourth cell die 14 may comprise a type of the PRAM. Though exemplary cell types of the plurality of dies are disclosed herein, other combinations may be used, and this disclosure is not limited to the exemplary combinations described.

In one embodiment, a respective cell die of the first through fourth cell dies 11 through 14 each including a plurality of memory cells may be a respective memory chip, and the respective memory chips may be formed from the same wafer or a different wafer. For example, each cell die may be a chip formed from a piece of a wafer. The buffer die 20 may be a buffer chip, and in one embodiment, the buffer chip may be formed from a wafer different from a wafer including the plurality of memory cells.

Each of the first through eighth cell cores Cell Core1 through Cell Core8 may correspond to first through eighth channels CH1 through CH8, respectively. For example, an i-th cell core may correspond to an i-th channel. A channel may include signals such as the address information ADD, the command CMD, the data signal DQ, and the data strobe signal DQS etc. Typically, signals associated with a cell core are transmitted through the channel corresponding to that cell core. Accordingly, signals related to each of the cell cores Cell Core1 through Cell Core8 are normally not transmitted through channels that do not correspond to the respective cell core. In other embodiments, cell cores may correspond not one-on-one but one-to-n or m-to-one with channels, where "n" and "m" are integers. More details, particularly for certain situations, related to these channels will be described below.

The first through fourth cell dies 11 through 14 may overlap one another in a stack structure. For example, adjacent dies among the first through fourth cell dies 11 through 14 may be electrically connected to each other through a through-substrate via (e.g., through-silicon via TSV) 16 formed by a conductive material like, for example, copper (Cu). For instance, a signal for accessing (e.g., performing a read, an erase or a write operation) on the first cell die 11 may be transferred through the second through fourth cell dies 12 through 14 and the TSV 16 between the first cell die 11 and the buffer die 20.

Figure 3:
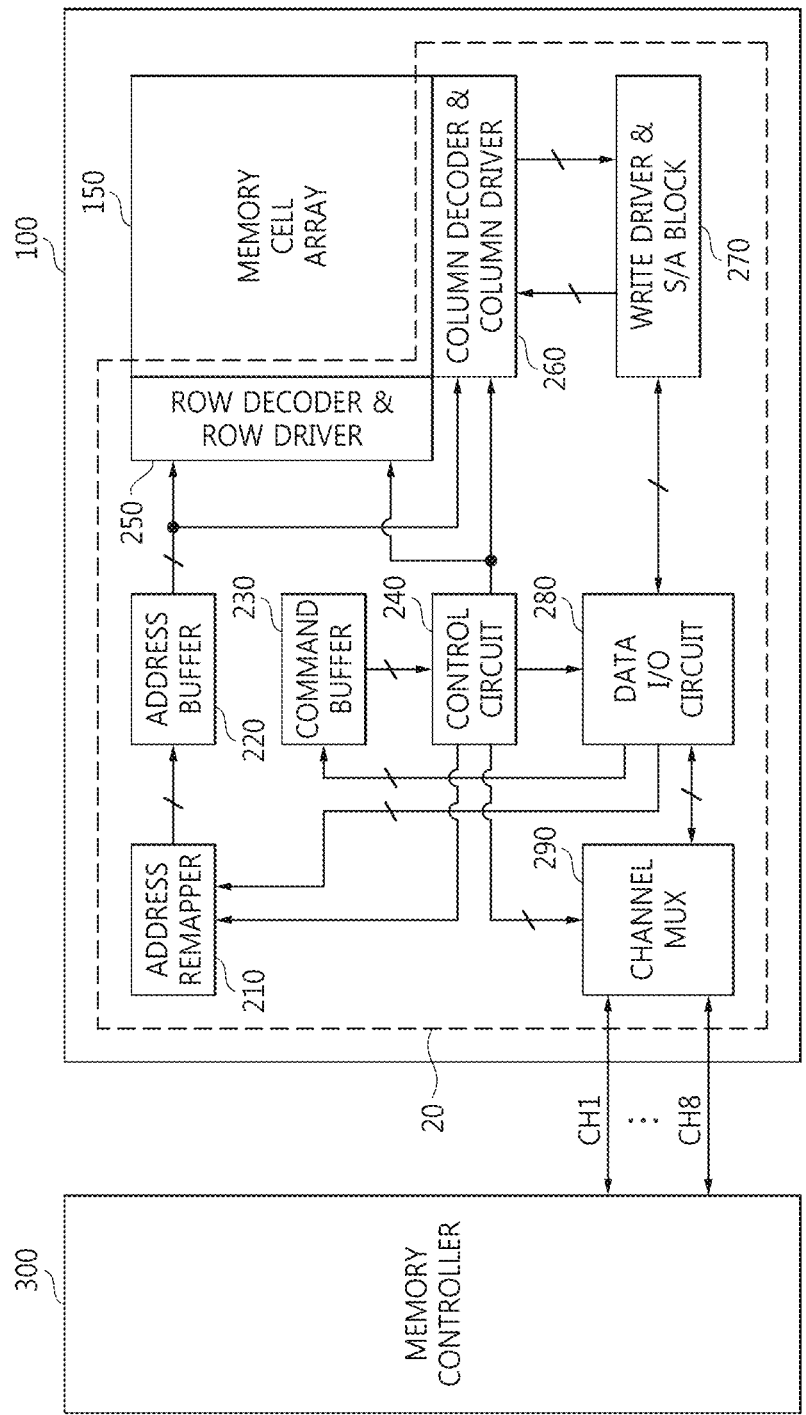
FIG. 3 is a detailed block diagram of a memory system illustrated in FIG. 1 according to example embodiments.

The buffer die 20 may include a plurality of logic circuits, e.g., elements of the buffer die 20 illustrated in FIG. 3, to communicate signals with the memory controller 300 through the first through eighth channels CH1 through CH8 and to execute the request (e.g., a read or write operation) of the memory controller 300. The structure and operations of the buffer die 20 will be described in detail with reference to FIG. 3.

Figure 4:
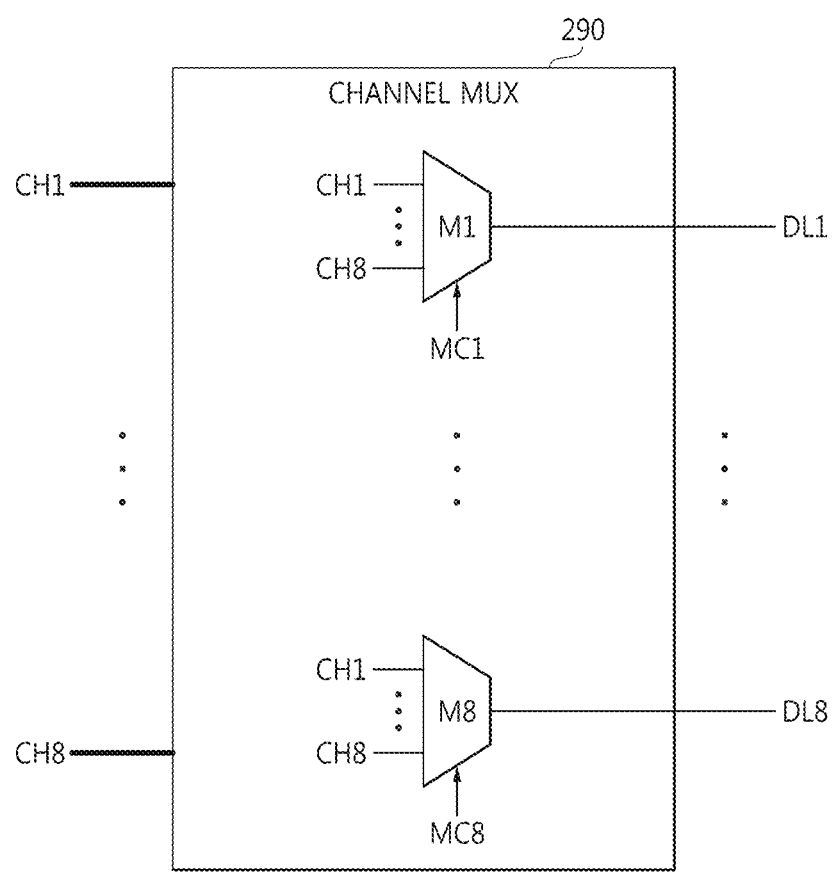
FIG. 4 is a block diagram of a channel multiplexer illustrated in FIG. 3 according to example embodiments.

FIG. 3 is a detailed block diagram of the memory system 10 illustrated in FIG. 1 according to example embodiments. FIG. 4 is a block diagram of a channel multiplexer (MUX) 290 illustrated in FIG. 3 according to example embodiments.

Referring to FIGS. 1 through 4, the memory system 10 may include the semiconductor memory device 100 and the memory controller 300. FIG. 3 shows a semiconductor memory device 100, e.g., one of the dies RAM0 through RAMp, and the memory controller 300. The semiconductor memory device 100 may include a memory cell array 150 and the buffer die 20.

The memory cell array 150 includes word lines, bit lines, and memory cells each connected with one of the word lines and one of the bit lines. The memory cells may store data of at least one bit. The memory cells may be formed with non-volatile memory cells that retain data regardless of supplying a power supply voltage or volatile memory cells that retain data only while a power supply voltage is supplied. Data may be stored in the memory cells by physical fuse-cutting using a laser or by electrical programming. The memory cells may be formed using, for example, dynamic random access memory (DRAM), static RAM (SRAM), synchronous DRAM (SDRAM), electrically erasable programmable read-only memory (EEPROM), flash memory, magnetic random access memory (MRAM), spin-transfer torque MRAM, conductive bridging RAM (CBRAM), ferroelectric RAM (FeRAM), phase-change RAM (PRAM), or resistive RAM (RRAM or ReRAM).

The memory cell array 150 may be formed with the first through fourth cell dies 11 through 14 illustrated in FIG. 2. For example, the memory cell array 150 may include first through eighth cell cores Cell Core1 through Cell Core8. As described above with reference to FIG. 2, the number of dies or cell cores included in the memory cell array 150 is not limited, but it is assumed that the memory cell array 150 includes eight cell cores Cell Core1 through Cell Core8 in the present embodiments for convenience' sake in the description.

The buffer die 20 may include an address remapper 210, an address buffer 220, a command buffer 230, a control circuit 240, a row decoder and row driver 250, a column decoder and column driver 260, a write driver and sense amplifier (S/A) block 270, a data input/output (I/O) circuit 280, and the channel MUX 290. The buffer die 20 may be referred to as an access circuit for accessing the memory cell array 150.

The address remapper 210 may perform address remapping on the address information ADD received from the data I/O circuit 280 according to the control of the control circuit 240. The address information ADD includes an address of a memory cell to be accessed by requesting a read, write or erase operation. Here, address remapping may refer to converting an address of a failed cell among memory cells included in the first through eighth cell cores Cell Core1 through Cell Core8 into an address of a redundant cell in a cell core corresponding to a failed channel.

A failed cell may be a memory cell that has been judged as poor in a test mode of the semiconductor memory device 100. The test mode may be commenced by a test command of the memory controller 300 or by the control of the control circuit 240. A failed cell may be detected by repeatedly writing certain data (e.g., 0 or 1) to memory cells and comparing the certain data with results of repeatedly reading the data that has been written. A test circuit (not shown) for detecting a good or bad cell may judge a cell as a good cell (e.g., a normal cell) or a bad cell (e.g., a failed cell) based on the comparison result.

The test circuit may be included within the memory controller 300, but the inventive concept is not restricted to the present example. The test circuit may be included in the semiconductor memory device 100 or may be implemented independently. For convenience' sake in the description, it is assumed that the test circuit is included in the memory controller 300.

A failed channel may be a channel that has been judged as poor in the test mode. A failed channel may be detected by repeatedly writing certain data (e.g., 0 or 1) to memory cells through the first through eighth channels CH1 through CH8 using the memory controller 300, receiving data repeatedly read through the first through eighth channels CH1 through CH8, and comparing the read data with the certain data. The memory controller 300 may judge a channel as poor (e.g., bad or failed) or normal (e.g., good) based on the comparison result. For example, in one embodiment, the failed channel is detected when at least one of signal lines of the channel is disconnected (e.g., the signal line is broken).

A redundant cell may be a memory cell included in a cell core corresponding to a failed channel among the first through eighth cell cores Cell Core1 through Cell Core8. For example, if a channel corresponding to a particular cell core fails, that cell core may then be treated as and may function as, a redundant cell core.

The address remapper 210 may transmit an address of a normal cell among the memory cells included in the first through eighth cell cores Cell Core1 through Cell Core8 without performing the address remapping on the address of the normal cell. The address buffer 220 may temporarily store the address information ADD received from the address remapper 210 and may transmit the address information ADD to the row decoder and row driver 250 according to the control of the control circuit 240.

The command buffer 230 may temporarily store the command CMD received from the data I/O circuit 280 and may transmit the command CMD to the control circuit 240 according to the control of the control circuit 240.

The control circuit 240 may control the overall operation of the semiconductor memory device 100. The control circuit 240 may include a command decoder (not shown), a clock generator (not shown), and a mode register set (MRS) circuit (not shown). The control circuit 240 may control the semiconductor memory device 100 to perform a certain operation according to a result of interpreting the command CMD (e.g., a read command, a write command, an erase command, a refresh command, or a test command) received from the command buffer 230. In particular, when receiving a request to access to a failed cell, the control circuit 240 may control the address remapping of the address remapper 210 and the operation of the channel MUX 290, which will be described later.

The control circuit 240 may control the address remapper 210 based on a failed-cell command. The failed-cell command may include information about an address of a failed cell. For example, the control circuit 240 may detect the address of the failed cell according to the failed-cell command and may control the address remapper 210 to perform the address remapping when the address remapper 210 receives the address information of the failed cell.

The control circuit 240 may control the channel MUX 290 based on a failed-channel command. The failed-channel command may include information about a failed channel. For example, the control circuit 240 may detect which of the channels CH1 through CH8 is a failed channel according to the failed-channel command and may control the channel MUX 290 to transfer data (i.e., read data or write data) of a redundant cell corresponding to the failed channel through a normal channel (hereinafter, the normal channel may be referred to as a good channel compared to a failed or bad channel) corresponding to the failed cell.

The failed-cell command and the failed-channel command may be generated by the memory controller 300 according to a result of the test mode of the semiconductor memory device 100 and may be transmitted in a form of the command CMD.

The control circuit 240 may control the timing of the operation of each circuit (e.g., 210) of the semiconductor memory device 100.

The row decoder and row driver 250 may select one of the word lines in the memory cell array 150 based on the address information ADD output from the address buffer 220 and may drive the selected word line to a necessary operating voltage.

The column decoder and column driver 260 may control the connection between each of the bit lines in the memory cell array 150 and the write driver and S/A block 270 based on the address information ADD output from the address buffer 220.

The write driver and S/A block 270 may generate a current (or, a voltage) signal corresponding to write data based on the write data received from the data I/O circuit 280 and may apply the current (or, the voltage) signal to at least one bit line connected by the column decoder and column driver 260. The write driver and S/A block 270 may sense and amplify a signal output from the at least one bit line connected by the column decoder and column driver 260 to generate read data corresponding to the sensed and amplified signal and may transmit the read data to the data I/O circuit 280.

The data I/O circuit 280 may include a data input circuit (not shown) and a data output circuit (not shown), which operate according to the control of the control circuit 240. The data input circuit may identify a type of data received through data lines (DL1 through DL8 in FIG. 4) and may transmit the data to the address remapper 210, the command buffer 230, or the write driver and S/A block 270 according to the identification result. In detail, the data input circuit may transmit the data to the address remapper 210 when/if the data is the address information ADD, may transmit the data to the command buffer 230 when/if the data is the command CMD, and may transmit the data to the write driver and S/A block 270 when/if the data is write data.

The data output circuit may output read data to the first through eighth channels CH1 through CH8 through the data lines DL1 through DL8 corresponding to the respective cell cores Cell Core1 through Cell Core8 based on the read data received from the write driver and S/A block 270. The data lines DL1 through DL8 correspond to the first through eighth cell cores Cell Core1 through Cell Core8, respectively.

The data lines DL1 through DL8 may be connected to an output driver (not shown) of the data I/O circuit 280. The output driver may be implemented as a part of the data input circuit and a part of the data output circuit. The output driver may be a low voltage swing terminated logic (LVSTL) output driver in which a pull-up transistor and a pull-down transistor are formed with N-channel metal oxide semiconductor (NMOS) transistors.

The channel MUX 290 may control the connection between the data lines DL1 through DL8 and the channels CH1 through CH8 according to the control of the control circuit 240.

Referring to FIG. 4, the channel MUX 290 may include a plurality of MUXs M1 through M8 controlling the connections between the data lines DL1 through DL8 and the channels CH1 through CH8. The first MUX M1 may connect the first data line DL1 to one of the channels CH1 through CH8 according to a first MUX control signal MC1. The first MUX control signal MC1 may include three binary bits and a combination of three binary bits may be mapped to one of the channels CH1 through CH8. For instance, when a combination of three binary bits is "000", the first data line DL1 may be connected to the first channel CH1. Similarly, the remaining MUXs M2 through M8 may connect the data lines DL2 through DL8, respectively, to one of the channels CH1 through CH8 according to MUX control signals MC2 through MC8, respectively. The MUX control signals MC1 through MC8 may be generated by the control circuit 240 so that one of the channels CH1 through CH8 is certainly connected to one of the data lines DL1 through DL8.

When transmitting read data or write data for a redundant cell in a cell core corresponding to a failed channel, the channel MUX 290 may connect a data line corresponding to the redundant cell to a normal channel. Therefore, the channel MUX 290 can receive the read data from the redundant cell through the data line corresponding to the redundant cell and transmit the read data to the normal channel. In addition, the channel MUX 290 can receive the write data to be written into the redundant cell from the normal channel and transmit the write data to the data line corresponding to the redundant cell.

The memory controller 300 may transmit to the semiconductor memory device 100 various commands CMD for controlling the operation of the semiconductor memory device 100 and the address information ADD regarding the memory cell array 150 on which a read, write or test operation will be performed. The memory controller 300 may transmit write data to be written to the memory cell array 150 to the semiconductor memory device 100 and may receive read data from the semiconductor memory device 100. The memory controller 300 may control the semiconductor memory device 100 through the channels CH1 through CH8 respectively corresponding to the cell cores Cell Core1 through Cell Core8 and may transmit and receive the command CMD, the address information ADD, or read/write data related with each of the cell cores Cell Core1 through Cell Core8.

Figure 5:
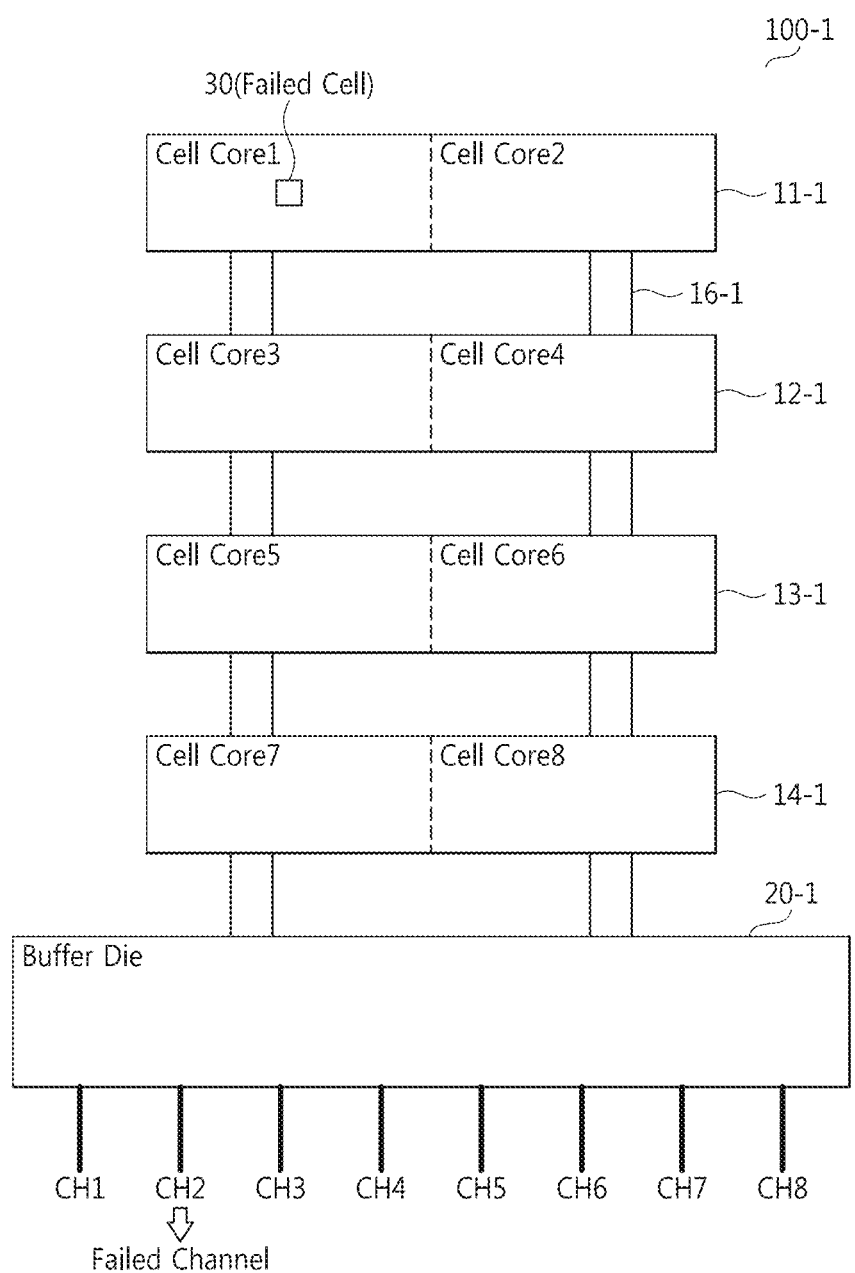
FIG. 5 is a block diagram for explaining a method of operating a semiconductor memory device in a comparison example.
Figure 6:
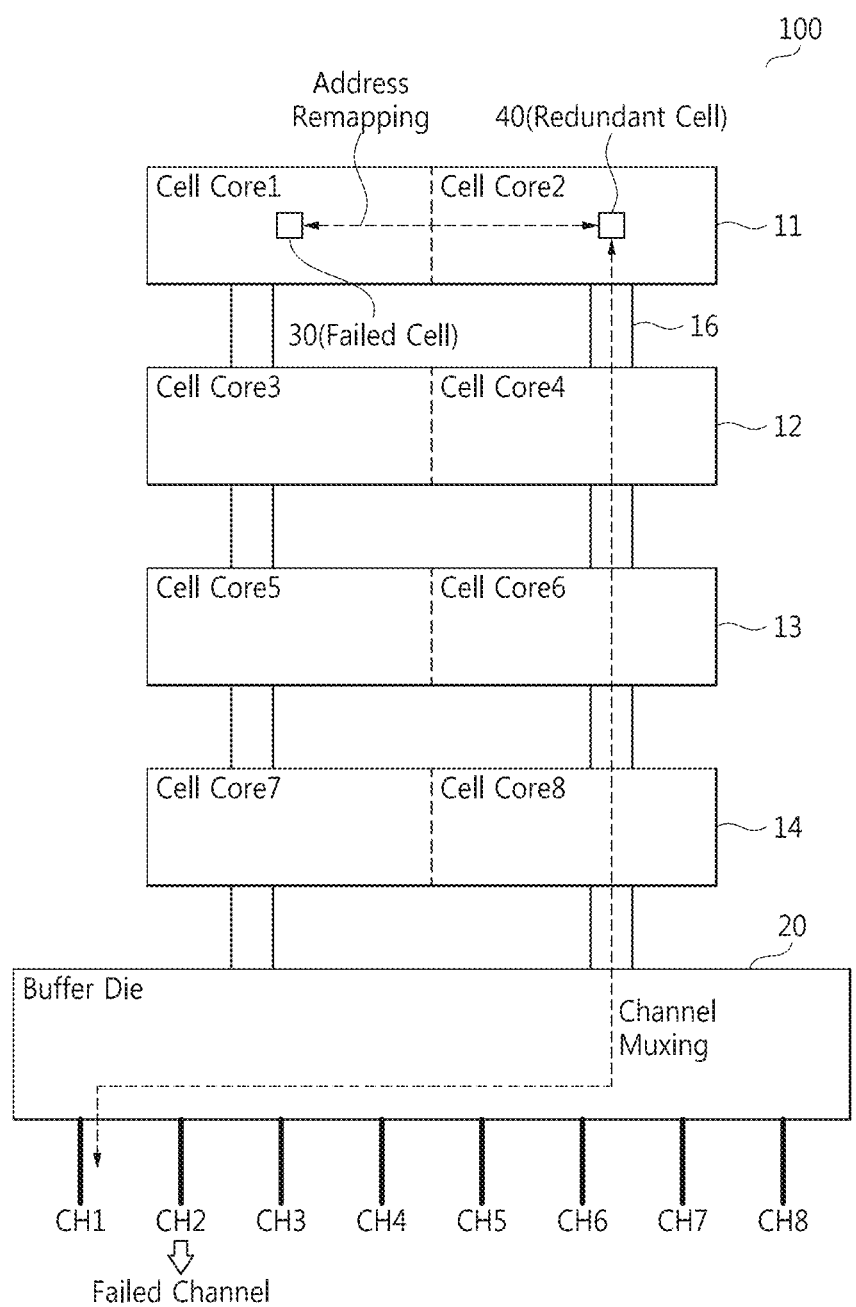
FIG. 6 is a block diagram for explaining a method of operating a semiconductor memory device illustrated in FIG. 3 according to example embodiments.

FIG. 5 is a block diagram for explaining a method of operating a semiconductor memory device 100-1 in a comparison example. FIG. 6 is a block diagram for explaining a method of operating the semiconductor memory device 100 illustrated in FIG. 3 according to example embodiments. Referring to FIGS. 1 through 6, the semiconductor memory device 100-1 may include similar elements 11-1 through 14-1, 16-1, and 20-1 to the elements 11 through 14, 16, and 20 of the semiconductor memory device 100 illustrated in FIG. 2, but the semiconductor memory device 100-1 does not include the address remapper 210 and/or the channel MUX 290 illustrated in FIG. 3.

It is assumed that one of the cells in the first cell core Cell Core1 is a failed cell 30 and the second channel CH2 corresponding to the second cell core Cell Core2 is a failed channel. Since the second channel CH2 is a failed channel, data for the second cell core Cell Core2 cannot be transmitted through the second channel CH2. Accordingly, it is not possible to store data or read data in/from any cell in the second cell core Cell Core2. In other words, all cells in the second cell core Cell Core2 of the semiconductor memory device 100-1 cannot be used.

In addition, since data cannot be normally written to or read from the failed cell 30 in the first cell core Cell Core1, neither a write nor a read operation should be performed on the failed cell 30 for the normal operation of the semiconductor memory device 100-1. Therefore, the failed cell 30 in the first cell core Cell Core1 of the semiconductor memory device 100-1 cannot be used.

Consequently, even though no cells in the second cell core Cell Core2 of the semiconductor memory device 100-1 are failed cells, any cell in the second cell core Cell Core2 cannot be used since the second channel CH2 corresponding to the second cell core Cell Core2 is a failed channel.

Unlike the semiconductor memory device 100-1 illustrated in FIG. 5, the semiconductor memory device 100 illustrated in FIG. 6 may include the address remapper 210 and the channel MUX 290 illustrated in FIG. 3. Similarly to the comparison example illustrated in FIG. 5, it is assumed that the first cell core Cell Core1 includes the failed cell 30 and the second channel CH2 corresponding to the second cell core Cell Core2 is a failed channel.

The control circuit 240 may detect an address of the failed cell 30 and a position of the failed channel CH2 based on a failed-cell command and a failed-channel command. When the semiconductor memory device 100 receives a command to perform an access (e.g., a read or write operation) on the failed cell 30, for example, when the address remapper 210 receives the address of the failed cell 30, the control circuit 240 may control the address remapper 210 to perform address remapping on the address of the failed cell 30.

The address remapping may be performed by converting the address of the failed cell 30 into an address of a redundant cell 40 included in the second cell core Cell Core2 corresponding to the failed channel, i.e., the second channel CH2. The address of the redundant cell 40 may be randomly determined within the second cell core Cell Core2, but the mapping relation between the address of the failed cell 30 and the address of the redundant cell 40 may be managed by the control circuit 240 or the address remapper 210.

When a read operation is requested on the failed cell 30, the redundant cell 40 may be selected according to address information resulting from the conversion by the address remapper 210 and data in the redundant cell 40 may be transmitted to the data I/O circuit 280 as read data. The channel MUX 290 may receive the read data from the redundant cell 40 through the second data line DL2 corresponding to the redundant cell 40 and may output the read data to the first channel CH1 corresponding to the failed cell 30 instead of the second channel CH2 corresponding to the redundant cell 40 according to the control of the control circuit 240.

When a write operation is requested on the failed cell 30, the redundant cell 40 may be selected according to the address information resulting from the conversion by the address remapper 210 and write data for the failed cell 30 may be received through the first channel CH1. The channel MUX 290 may receive the write data through the first channel CH1, which is normal, and may output the write data not to the first data line DL1 corresponding to the failed cell 30 but to the second data line DL2 corresponding to the redundant cell 40 according to the control of the control circuit 240. The write data may be written to the redundant cell 40 that has been selected.

Consequently, unlike the semiconductor memory device 100-1 illustrated in FIG. 5, the semiconductor memory device 100 may use a memory cell in a cell core corresponding to a failed channel as a redundant cell by replacing a failed cell in a cell core corresponding to a normal channel with a normal cell in a cell core corresponding to a failed channel, thereby reducing the waste of memory space and increasing the efficiency of the semiconductor memory device 100. This process may also be described as "swapping," for example, swapping a failed cell core corresponding to a normal channel with a normal cell core corresponding to a failed channel. Although there are only one failed cell and one failed channel in the examples illustrated in FIGS. 5 and 6, the inventive concept is not restricted to these examples. Substantially the same method as described above can be applied to other cases where there are a plurality of failed cells and failed channels.

Figure 7:
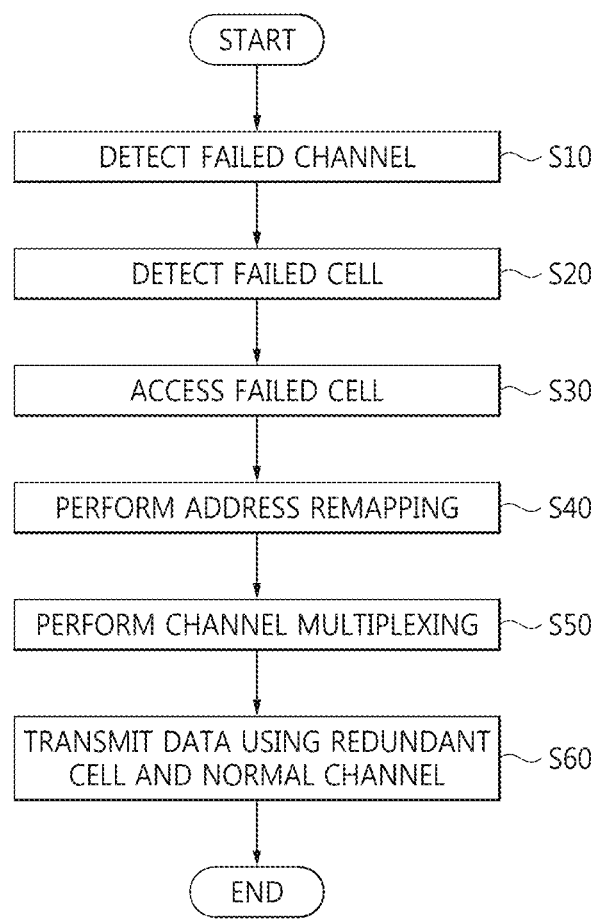
FIG. 7 is a flowchart of the method of operating the semiconductor memory device illustrated in FIG. 3 according to example embodiments.

FIG. 7 is a flowchart of the method of operating the semiconductor memory device 100 illustrated in FIG. 3 according to example embodiments. Referring to FIGS. 1 through 4, 6 and 7, the control circuit 240 may detect a failed channel (e.g., a second channel CH2) among the channels CH1 through CH8 based on a failed-channel command corresponding to information about the failed channel judged as poor in test mode of the semiconductor memory device 100 in operation S10. The control circuit 240 may detect an address of the failed cell 30 according to a failed-cell command corresponding to information about the address of the failed cell 30 judged as poor in the test mode in operation S20.

The control circuit 240 may receive a command to access the failed cell 30 in operation S30. In one embodiment, the detection of the failed channel CH2 and the failed cell 30 may be performed by the memory controller 300 that controls the semiconductor memory device 100.

When the command to access is a read command, the address remapper 210 may convert the address of the failed cell 30 into the address of the redundant cell 40 according to the control of the control circuit 240 in operation S40. The redundant cell 40 may be selected according to address information resulting from the conversion and data of the redundant cell 40 may be transmitted as read data to the data I/O circuit 280. The channel MUX 290 may connect the second data line DL2 corresponding to the redundant cell 40 with the first channel CH1, which is a normal channel, according to the control of the control circuit 240 in operation S50. The channel MUX 290 may receive the read data from the redundant cell 40 through the second data line DL2 corresponding to the redundant cell 40. The channel MUX 290 may output the read data to the first channel CH1 corresponding to the failed cell 30 instead of the second channel CH2 corresponding to the redundant cell 40 according to the control of the control circuit 240 in operation S60.

When the command to access is a write command, the address remapper 210 may convert the address of the failed cell 30 into the address of the redundant cell 40 according to the control of the control circuit 240 in operation S40. The redundant cell 40 may be selected according to address information resulting from the conversion and write data for the failed cell 30 may be received through the first channel CH1. The channel MUX 290 may connect the second data line DL2 corresponding to the redundant cell 40 with the first channel CH1, which is a normal channel, according to the control of the control circuit 240 in operation S50. The channel MUX 290 may receive the write data for the failed cell 30 through the first channel CH1. The channel MUX 290 may output the write data to the second data line DL2 corresponding to the redundant cell 40 instead of the first data line DL1 corresponding to the failed cell 30 according to the control of the control circuit 240 in operation S60. The write data may be written to the redundant cell 40.

Figure 8:
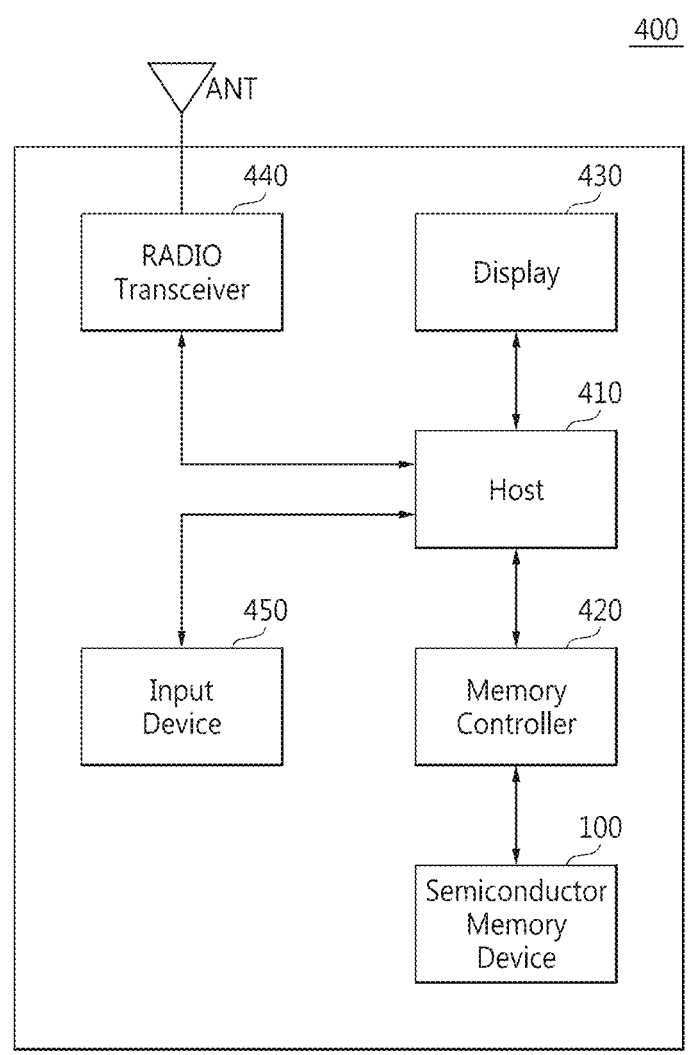
FIG. 8 is a block diagram of a computer system including the semiconductor memory device illustrated in FIG. 1 according to some embodiments of the inventive concept.

FIG. 8 is a block diagram of a computer system 400 including the semiconductor memory device 100 illustrated in FIG. 1 according to some embodiments of the inventive concept. Referring to FIGS. 1 and 8, the computer system 400 may be an electronic device implemented as a cellular phone, a smart phone, a tablet personal computer (PC), a personal digital assistant (PDA) or a radio communication device.

The computer system 400 includes the semiconductor memory device 100 and a memory controller 420 controlling the operations of the semiconductor memory device 100. The memory controller 420 may control the data access operations, e.g., a write operation or a read operation, of the semiconductor memory device 100 according to the control of a host 410. The memory controller 420 may be the memory controller 300 illustrated in FIG. 1.

The data in the semiconductor memory device 100 may be displayed through a display 430 according to the control of the host 410 and/or the memory controller 420.

A radio transceiver 440 transmits or receives radio signals through an antenna ANT. The radio transceiver 440 may convert radio signals received through the antenna ANT into signals that can be processed by the host 410. Accordingly, the host 410 may process the signals output from the radio transceiver 440 and transmit the processed signals to the memory controller 420 or the display 430. The memory controller 420 may program the signals processed by the host 410 to the semiconductor memory device 100.

The radio transceiver 440 may also convert signals output from the host 410 into radio signals and outputs the radio signals to an external device through the antenna ANT.

An input device 450 enables control signals for controlling the operation of the host 410 or data to be processed by the host 410 to be input to the computer system 400. The input device 450 may be implemented by a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the semiconductor memory device 100, may be implemented as a part of the host 410 or as a separate chip.

Figure 9:
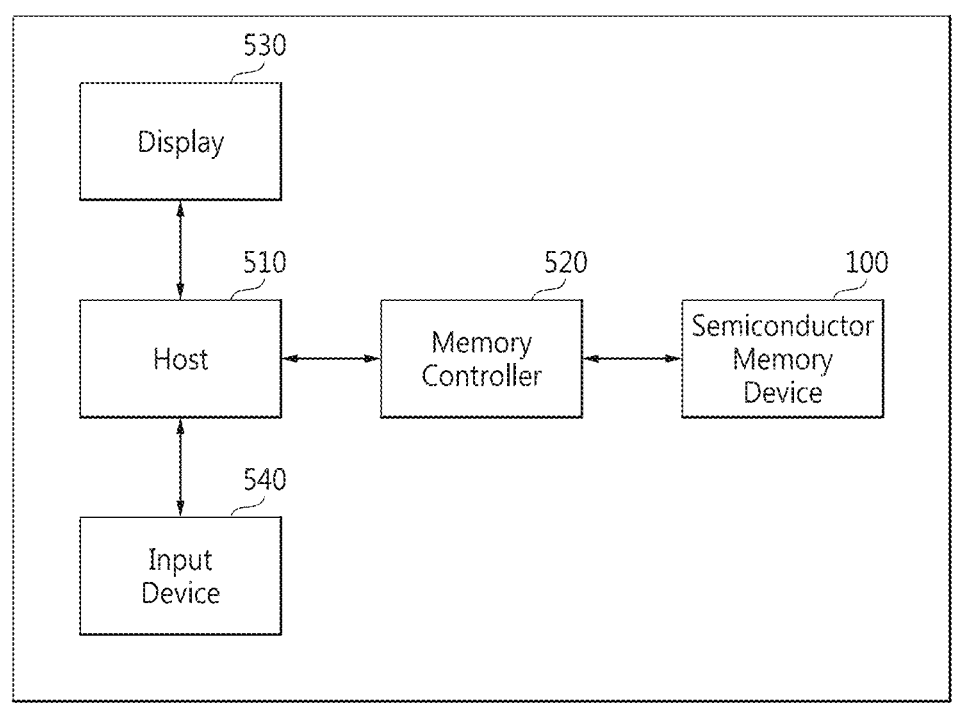
FIG. 9 is a block diagram of a computer system including the semiconductor memory device illustrated in FIG. 1 according to other embodiments of the inventive concept.

FIG. 9 is a block diagram of a computer system 500 including the semiconductor memory device 100 illustrated in FIG. 1 according to other embodiments of the inventive concept. The computer system 500 may be implemented as an electronic device such as a personal computer (PC), a tablet PC, a netbook, an e-reader, a personal digital assistant (PDA), a portable multimedia player (PMP), an MP3 player, or an MP4 player.

The computer system 500 includes a host 510, the semiconductor memory device 100, a memory controller 520 controlling the data processing operations of the semiconductor memory device 100, a display 530 and an input device 540.

The host 510 may display data stored in the semiconductor memory device 100 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520. The memory controller 520 may be the memory controller 300 illustrated in FIG. 1.

According to some embodiments, the memory controller 520, which may control the operations of the semiconductor memory device 100, may be implemented as a part of the host 510 or as a separate chip.

Figure 10:
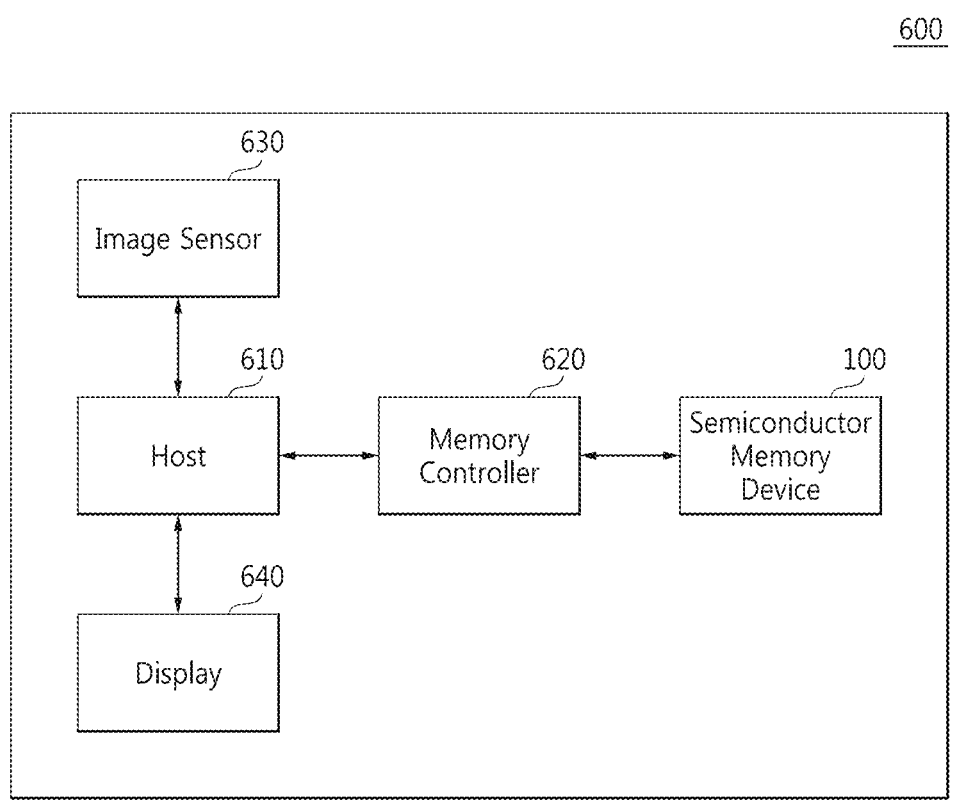
FIG. 10 is a block diagram of a computer system including the semiconductor memory device illustrated in FIG. 1 according to other embodiments of the inventive concept.

FIG. 10 is a block diagram of a computer system 600 including the semiconductor memory device 100 illustrated in FIG. 1 according to other embodiments of the inventive concept. The computer system 600 may be implemented as an image processing device such as a digital camera, a cellular phone equipped with a digital camera, or a smart phone equipped with a digital camera.

The computer system 600 includes a host 610, the semiconductor memory device 100 and a memory controller 620 controlling the data processing operations, such as a write operation or a read operation, of the semiconductor memory device 100. The computer system 600 further includes an image sensor 630 and a display 640

The image sensor 630 included in the computer system 600 converts optical images into digital signals and outputs the digital signals to the host 610 or the memory controller 620. The digital signals may be controlled by the host 610 to be displayed through the display 640 or stored in the semiconductor memory device 100 through the memory controller 620.

Data stored in the semiconductor memory device 100 may be displayed through the display 640 according to the control of the host 610 or the memory controller 620. The memory controller 620, which may control the operations of the semiconductor memory device 100, may be implemented as a part of the host 610 or as a separate chip. The memory controller 620 may be the memory controller 300 illustrated in FIG. 1.

Figure 11:
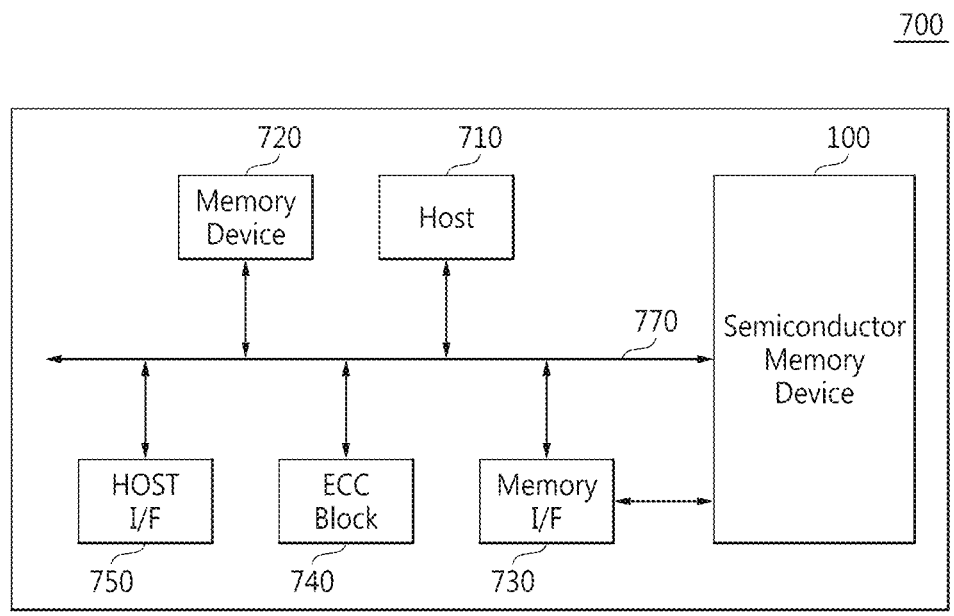
FIG. 11 is a block diagram of a computer system including the semiconductor memory device illustrated in FIG. 1 according to yet other embodiments of the inventive concept.

FIG. 11 is a block diagram of a computer system 700 including the semiconductor memory device 100 illustrated in FIG. 1 according to yet other embodiments of the inventive concept. The computer system 700 includes the semiconductor memory device 100 and a host 710 controlling the operations of the semiconductor memory device 100.

The computer system 700 also includes a system memory 720, a memory interface 730, an error correction code (ECC) block 740, and a host interface 750.

The system memory 720 may be used an operation memory of the host 710. The system memory 720 may be implemented by a non-volatile memory like read-only memory (ROM) or a volatile memory like static random access memory (SRAM).

The host 710 connected with the computer system 700 may perform data communication with the semiconductor memory device 100 through the memory interface 730 and the host interface 750.

The ECC block 740 is controlled by the host 710 to detect an error bit included in data output from the semiconductor memory device 100 through the memory interface 730, correct the error bit, and transmit the error-corrected data to the host through the host interface 750. The host 710 may control data communication among the memory interface 730, the ECC block 740, the host interface 750, and the system memory 720 through a bus 770. The computer system 700 may be implemented as a flash memory drive, a USB memory drive, an IC-USB memory drive, or a memory stick.

Figure 12:
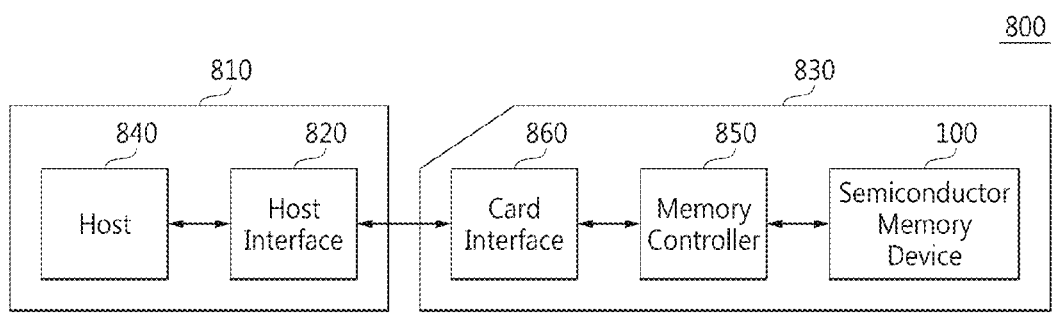
FIG. 12 is a block diagram of a computer system including the semiconductor memory device illustrated in FIG. 1 according to further embodiments of the inventive concept.

FIG. 12 is a block diagram of a computer system 800 including the semiconductor memory device 100 illustrated in FIG. 1 according to further embodiments of the inventive concept. The computer system 800 may be implemented as a host computer 810 and a memory card or a smart card. The computer system 800 includes the host computer 810 and the memory card 830.

The host computer 810 includes a host 840 and a host interface. The memory card 830 includes the semiconductor memory device 100, a memory controller 850, and a card interface 860. The memory controller 850 may control data exchange between the semiconductor memory device 100 and the card interface 860. The memory controller 850 may be the memory controller 300 illustrated in FIG. 1.

According to some embodiments, the card interface 860 may be a secure digital (SD) card interface or a multi-media card (MMC) interface, but the inventive concept is not restricted to the present embodiments.

When the memory card 830 is installed into the host computer 810, the card interface 860 may interface the host 840 and the memory controller 850 for data exchange according to a protocol of the host 840. The card interface 860 may support a universal serial bus (USB) protocol and an interchip (IC)-USB protocol. Here, the card interface 860 may indicate a hardware supporting a protocol used by the host 330, a software installed in the hardware, or a signal transmission mode.

When the computer system 800 is connected with the host interface 820 of the host computer 810 such as a PC, a tablet PC, a digital camera, a digital audio player, a cellular phone, a console video game hardware, or a digital set-top box, the host interface 820 may perform data communication with the semiconductor memory device 100 through the card interface 860 and the memory controller 850 according to the control of the host 840.

Figure 13:
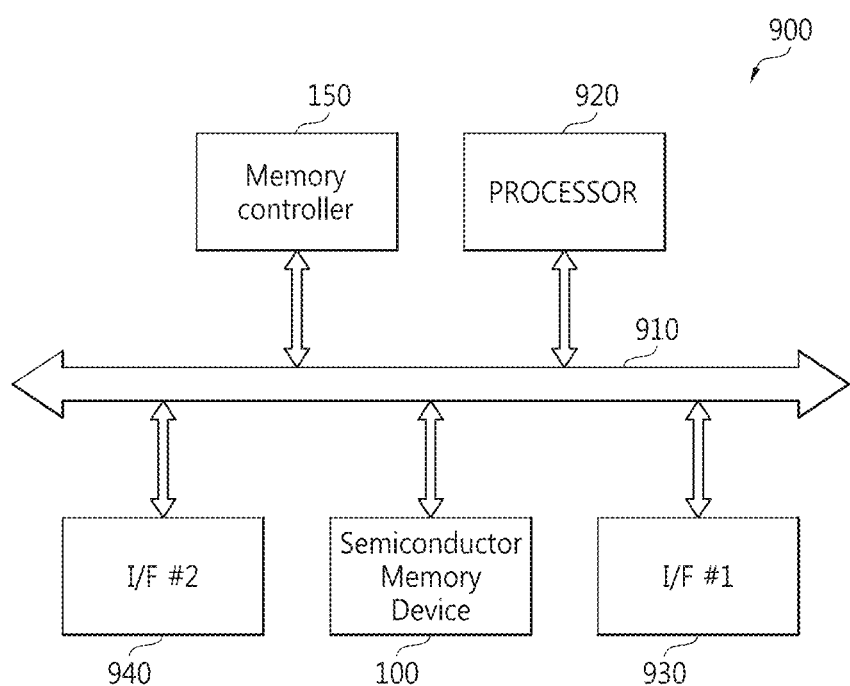
FIG. 13 is a block diagram of a computer system including the semiconductor memory device illustrated in FIG. 1 according to still other embodiments of the inventive concept.

FIG. 13 is a block diagram of a computer system 900 including the semiconductor memory device 100 illustrated in FIG. 1 according to still other embodiments of the inventive concept. The computer system 900 may include the semiconductor memory device 100, a memory controller 150, a processor 920 a first interface 930 and a second interface 940 which are connected to a data bus 910.

According to some embodiments, the computer system 900 may include a portable device such as a mobile phone, MP3 (MPECG Audio Layer-3) player, or MP4 (MPECG Audio Layer-4) player, a personal digital assistant (PDA), or a portable media player (PMP).

According to some embodiments, the computer system 900 may include a data processing system such as a personal computer (PC), a notebook-sized personal computer or a laptop computer.

According to some embodiments, the computer system 900 may include a memory card such as a secure digital (SD) card or a multimedia card (MMC)

According to some embodiments, the computer system 900 may include a smart card or a solid state drive (SSD)

The semiconductor memory device 100, the memory controller 150 and the processor may be implemented as one chip, for example, a system on chip (SoC) or as separate devices.

According to some embodiments, the processor 920 may process data input through the first interface 920 and write the data in the semiconductor memory device 100.

According to some embodiments, the processor 920 may read data from the semiconductor memory device 100 and output the data through the first interface 930. In this case, the first interface 930 may be an input/output device.

The second interface 940 may be a wireless interface for wireless communication.

According to some embodiments, the second interface 940 may be implemented by software or firmware.

Figure 14:
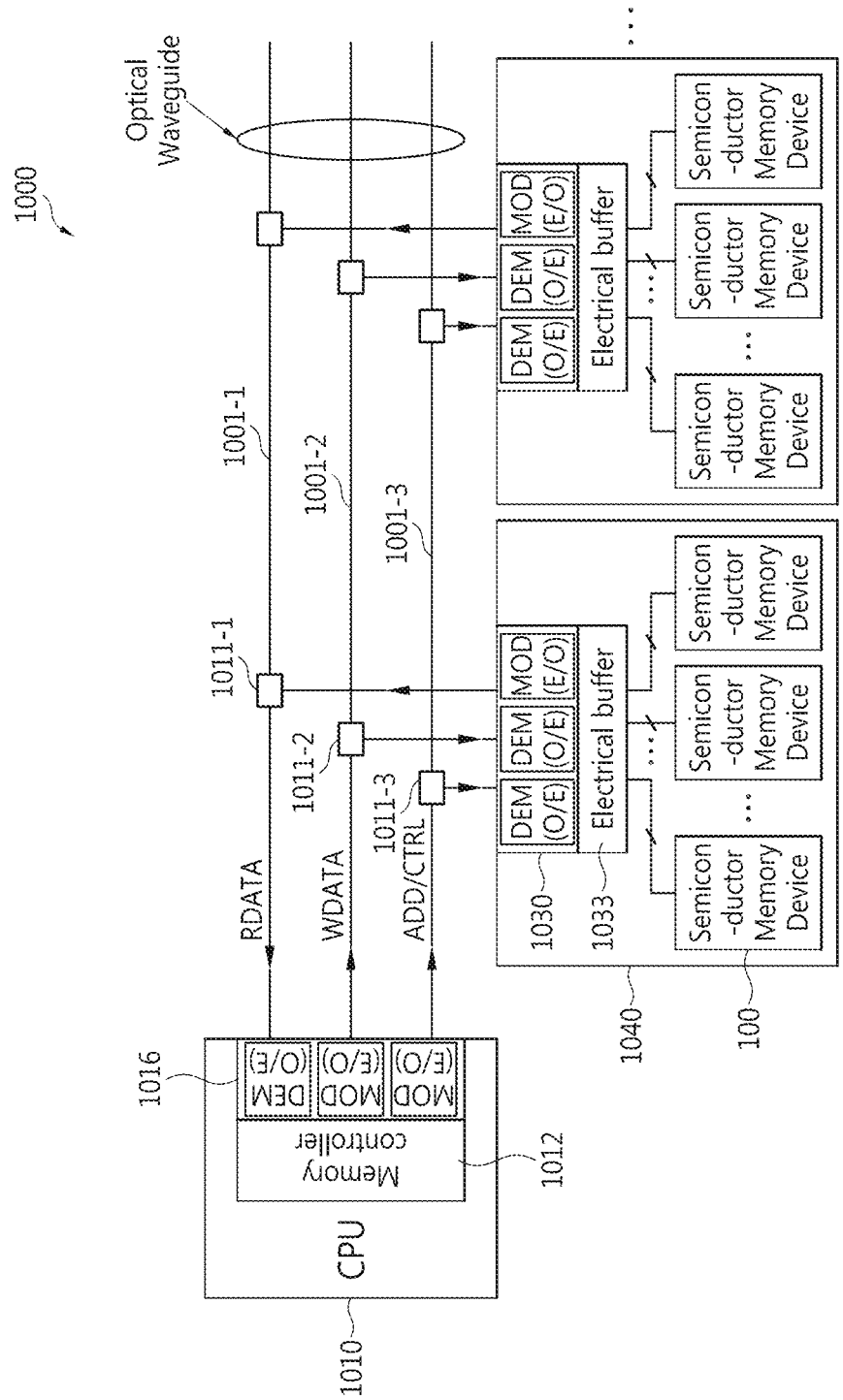
FIG. 14 is a block diagram of a data processing system including the semiconductor memory device illustrated in FIG. 1 according to some embodiments of the inventive concept.

FIG. 14 is a diagram of a data processing system 1000 including the semiconductor memory device 100 illustrated in FIG. 1. MOD (E/O) illustrated in FIG. 14 denotes an optical modulator used as an electro-optic (E/O) converter that converts an electrical signal into an optical signal and MOD (O/E) illustrated in FIG. 8 denotes an optical demodulator used as an opto-electric (O/E) converter that converts an optical signal into an electrical signal. Referring to FIG. 14, the data processing system 1000 includes a central processing unit (CPU) 1010, a plurality of data buses 1001-1 through 1001-3, and a plurality of memory modules 1040.

Each of the memory modules 1040 may transmit or receive optical signals through a plurality of couplers 1011-1 through 1011-3 respectively connected to the data buses 1001-1 through 1001-3. Each of the couplers 1011-1 through 1011-3 may be an electrical coupler or an optical coupler.

The CPU 1010 includes a memory controller 1012 and a first optical transceiver 1016 which includes at least one optical modulator MOD (E/O) and at least one optical demodulator DEM (O/E). The at least one optical demodulator DEM (O/E) is used as an O/E converter.

The memory controller 1012 may control an operation, e.g., a transmitting operation or a receiving operation, of the first optical transceiver 1016 under the control of the CPU 1010. The memory controller 1012 may be the memory controller 300 illustrated in FIG. 1.

In a write operation, a first optical modulator MOD (E/O) of the first optical transceiver 1016 may generate an optical signal ADD/CTRL by converting addresses and control signals under the control of the memory controller 1012 and may transmit the optical signal ADD/CTRL to the data bus 1001-3. Thereafter, a second optical modulator MOD (E/O) of the first optical transceiver 1016 may generate and transmit optical write data WDATA to the data bus 1001-2.

Each of the memory modules 1040 includes a second optical transceiver 1030 and a plurality of semiconductor memory devices 100. Each memory module 1040 may be implemented as an optical DIMM, a fully buffered optical DIMM, an optical small outline DIMM (SO-DIMM), an optical registered DIMM (RDIMM), an optical load reduced DIMM (LRDIMM), an unbuffered DIMM (UDIMM), an optical micro DIMM, or an optical SIMM.

An optical demodulator DEM (O/E) included in the second optical transceiver 1030 may demodulate the optical write data WDATA received through the data bus 1001-2 and transmit a demodulated electrical signal to at least one of the semiconductor memory devices 100. Each memory module 1040 may also include an electrical buffer 1033 which buffers the electrical signal output from the optical demodulator DEM (O/E). The electrical buffer 1033 may buffer a demodulated electrical signal and transmit a buffered electrical signal to at least one of the semiconductor memory devices 100.

In a read operation, an electrical signal output from each semiconductor memory device 100 is converted into optical read data RDATA by an optical modulator MOD (E/O) included in the second optical transceiver 1030. The optical read data RDATA is transmitted to the first optical demodulator DEM (O/E) included in the CPU 1010 through the data bus 1001-1. The first optical demodulator DEM (O/E) demodulates the optical read data RDATA and transmits a demodulated electrical signal to the memory controller 1012.

Figure 15:
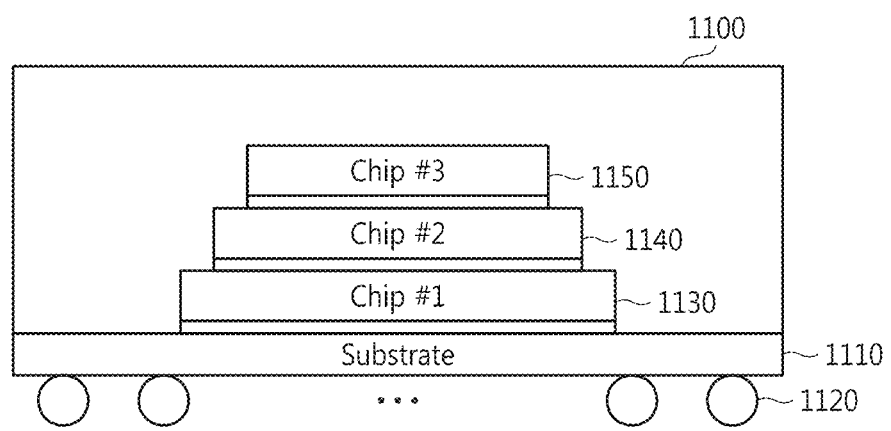
FIG. 15 is a schematic conceptual diagram of a multi-chip package including the semiconductor memory device illustrated in FIG. 1 according to example embodiments.

FIG. 15 is a schematic conceptual diagram of a multi-chip package 1100 including the semiconductor memory device 100 illustrated in FIG. 1. Referring to FIGS. 1 and 15, the multi-chip package 1100 may include a plurality of semiconductor devices, i.e., first through third chips 1130, 1140, and 1150 which are sequentially stacked on a package substrate 1110. Each of the semiconductor devices 1130 through 1150 may include the semiconductor memory device 100 illustrated in FIG. 1. A memory controller (not shown) for controlling the operations of the semiconductor devices 1130 through 1150 may be included within at least one of the semiconductor devices 1130 through 1150 or may be implemented on the package substrate 1110. A through-substrate via (e.g., a through-silicon via TSV) (not shown), a bonding wire (not shown), a bump (not shown), or a solder ball 1120 may be used to electrically connect the semiconductor devices 1130 through 1150 to each other.

In one embodiment, the first semiconductor device 1130 may be a logic die (or, a logic circuit die) including an input/output interface and a memory controller and each of the second and third semiconductor devices 1140 and 1150 may be a die, on which a plurality of memory devices are stacked, and may include a memory cell array. For example, each of a memory cell of the second semiconductor device 1140 and a memory device of the third semiconductor device 1150 may be the same or different types of memory.

In one embodiment, the first semiconductor device 1130 may be a the buffer die illustrated in FIG. 3 and each of the second and third semiconductor devices 1140 and 1150 may be the cell die illustrated in FIG. 3.

Alternatively, each of the first through third semiconductor devices 1130 through 1150 may include a memory controller. For example, the memory controller may be on the same die as a memory cell array or may be on a different die than the memory cell array.

As another alternative, the first semiconductor device 1130 may include an optical interface. A memory controller may be positioned in the first or second semiconductor device 1130 or 1140 and a memory cell array may be positioned in the second or third semiconductor device 1140 or 1150. The memory cell array may be connected with the memory controller through a TSV.

The multi-chip package 1100 may be implemented using hybrid memory cube (HMC) in which a memory controller and a memory cell array die are stacked. When the HMC is used, the performance of memory devices increases due to the increase of bandwidth and the area of the memory devices is reduced. As a result, power consumption and manufacturing cost can be reduced.

Figure 16:
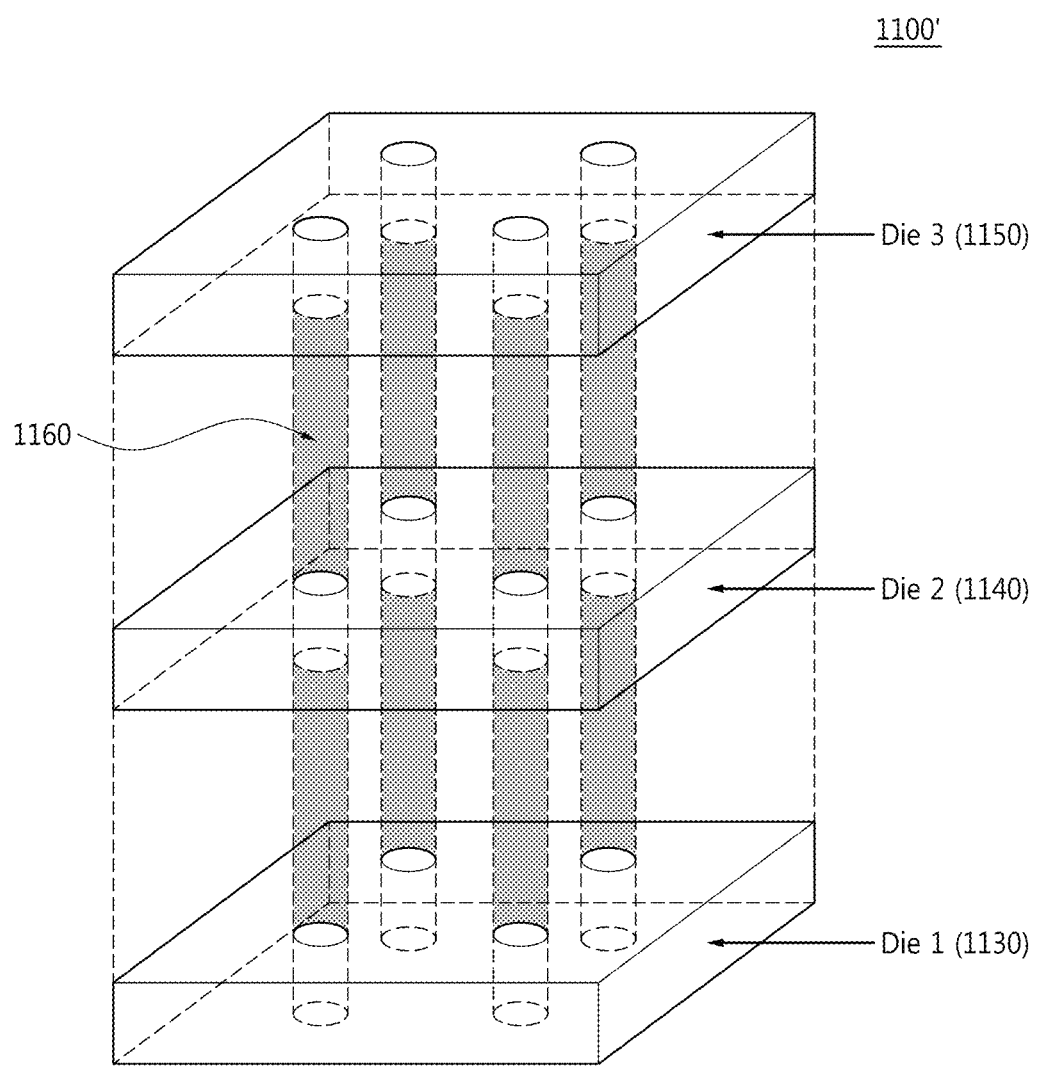
FIG. 16 is a three-dimensional conceptual diagram of an example of the multi-chip package illustrated in FIG. 15 according to example embodiments.

FIG. 16 is a three-dimensional conceptual diagram of an example 1100' of the multi-chip package 1100 illustrated in FIG. 15. Referring to FIGS. 1, 15 and 16, the multi-chip package 1100' includes a plurality of the dies 1130 through 1150 connected to each other through TSVs 1160 in a stack structure. Each of the dies 1130 through 1150 may include a plurality of circuit blocks (not shown) and a periphery circuit to realize the functions of the semiconductor memory device 100 illustrated in FIG. 3. The dies 1130 through 1150 may be referred to as a cell array. The plurality of circuit blocks may be implemented by memory blocks.

The TSVs 1160 may be formed of a conductive material including a metal such as copper (Cu). The TSVs 1160 are arranged at the center of a silicon substrate or a different material substrate from the silicon substrate (e.g., a germanium substrate etc.). The silicon substrate surrounds the TSVs 1160. An insulating region (not shown) may be disposed between the TSVs 1160 and the silicon substrate.

The present general inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to some embodiments of the inventive concept, a memory cell in a cell core corresponding to a failed channel is used as a redundant cell for a failed cell in a cell core corresponding to a normal channel, thereby minimizing the waste of memory space and maximizing efficiency of a memory system.

While the present disclosure has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A semiconductor memory device comprising:
   a memory cell array comprising a plurality of cell cores which comprise a first cell core corresponding to a first channel that is a normal channel and a second cell core corresponding to a second channel that is a failed channel; and
   an access circuit configured to perform address remapping by converting a first address of at least a first failed cell in the first cell core into a second address of at least a second cell in the second cell core, and to transmit data of at least the second cell through the first channel.

2. The semiconductor memory device of claim 1, wherein the access circuit comprises:
   an address remapper configured to perform the address remapping; and
   a channel multiplexer configured to transmit read data from at least the second cell to the first channel, and to transmit write data to at least the second cell through the first channel.

3. The semiconductor memory device of claim 2, wherein the semiconductor memory device is configured such that: when transferring the read data and the write data for at least the second cell, the channel multiplexer connects a second data line corresponding to the second cell core to the first channel.

4. The semiconductor memory device of claim 2, wherein the access circuit further comprises a control circuit configured to control the address remapper based on a failed-cell command corresponding to information about the first address of at least the first failed cell, and to control the channel multiplexer based on a failed-channel command corresponding to information about the failed channel.

5. The semiconductor memory device of claim 4, wherein the failed-cell command and the failed-channel command are generated by a memory controller in a test mode of the semiconductor memory device.

6. The semiconductor memory device of claim 4, wherein the access circuit further comprises:
   a data input/output circuit configured to detect a command and address information received from a memory controller according to control of the control circuit, and to transmit the read data and the write data;
   a write driver and sense amplifier block configured to transmit the write data to the memory cell array, and sense the read data from the memory cell array, respectively;
   a row decoder and row driver configured to select a first word line of a plurality of word lines based on address information resulting from the address remapping; and
   a column decoder and column driver configured to connect a first bit line of a plurality of bit lines to the write driver and sense amplifier block based on the address information resulting from the address remapping.

7. The semiconductor memory device of claim 6, wherein at least one cell core of the plurality of cell cores is disposed in a first cell die of a plurality of cell dies, and
   wherein the plurality of cell dies overlap each other in a stack structure and the plurality of cell cores are electrically connected to each other through through-substrate vias.

8. The semiconductor memory device of claim 2, wherein the semiconductor memory device is configured such that: when the access circuit receives a read command for at least the first failed cell, the address remapper converts the first address of at least the first failed cell into the second address of at least the second cell, and the channel multiplexer receives the read data from at least the second cell through a second data line corresponding to the second cell core and transmits the read data to the first channel.

9. The semiconductor memory device of claim 2, wherein the semiconductor memory device is configured such that: when the access circuit receives a write command for at least the first failed cell, the address remapper converts the first address of at least the first failed cell into the second address of at least the second cell, and the channel multiplexer receives the write data to be written to at least the second cell through the first channel and transmits the write data to a second data line corresponding to the second cell core.

10. A memory system comprising:
    a first semiconductor memory device including a first cell core corresponding to a first channel of a plurality of channels;
    a second semiconductor memory device including a second cell core corresponding to a second channel of the plurality of channels;
    a memory controller configured to control the first semiconductor memory device and the second semiconductor memory device through the plurality of channels connected to the first semiconductor memory device and the second semiconductor memory device, respectively; and
    an access circuit configured to perform address remapping by converting a first address of at least a first failed cell in the first cell core into a second address of at least a second cell in the second cell core, and to transmit data from/to at least the second cell through the first channel,
    wherein the first semiconductor memory device and the second semiconductor memory device are connected through through-substrate vias (TSVs).

11. The memory system of claim 10, wherein the access circuit comprises:
    an address remapper configured to perform the address remapping; and
    a channel multiplexer configured to transmit read data from at least the second cell to the first channel, and to transmit write data to at least the second cell through the first channel.

12. The memory system of claim 11, wherein the memory system is configured such that: when transferring the read data and the write data for at least the second cell, the channel multiplexer connects a second data line corresponding to the second cell core to the first channel.

13. The memory system of claim 11, wherein the access circuit further comprises a control circuit configured to control the address remapper based on a failed-cell command corresponding to information about the first address of at least the first failed cell, and to control the channel multiplexer based on a failed-channel command corresponding to information about a failed channel.

14. The memory system of claim 13, wherein the memory controller is configured to generate the failed-cell command and the failed-channel command in a test mode of the first and second semiconductor memory devices.

15. The memory system of claim 13, wherein the access circuit further comprises:
    a data input/output circuit configured to detect a command and address information received from a memory controller according to control of the control circuit and to transmit the read data and the write data;

a write driver and sense amplifier block configured to transmit the write data to at least the second cell, and sense the read data from at least the second cell, respectively;

a row decoder and row driver configured to select a first word line of a plurality of word lines based on address information resulting from the address remapping; and a column decoder and column driver configured to connect a first bit line of a plurality of bit lines to the write driver and sense amplifier block based on the address information resulting from the address remapping.

16. The memory system of claim 11, wherein the memory system configured such that: when the access circuit receives a read command for at least the first failed cell, the address remapper converts the first address of at least the first failed cell into the second address of at least the second cell, and the channel multiplexer receives the read data from at least the second cell through a second data line corresponding to the second cell core and transmits the read data to the first channel.

17. The memory system of claim 11, wherein the memory system configured such that: when the access circuit receives a write command for at least the first failed cell, the address remapper converts the first address of at least the first failed cell into the second address of at least the second cell, and the channel multiplexer receives the write data to be written to at least second cell through the first channel and transmits the write data to a second data line corresponding to the second cell core.

18. A method of operating a semiconductor memory device including a first set of sub-arrays, each sub-array having a plurality of memory cells, the method comprising:

detecting a second failed channel of a plurality of channels and a first failed cell of a first sub-array of the first set of sub-arrays;

converting a first address of the first failed cell into a second address of a second cell of a second sub-array of the first set of sub-arrays corresponding to the second failed channel when the first failed cell is requested; and transmitting data of the second cell through a first channel corresponding to the first sub-array including the first failed cell.

19. The method of claim 18, further comprising connecting a first data line corresponding to the second cell to the first channel.

20. The method of claim 18, wherein detecting the second failed channel and the first failed cell is performed by a memory controller that controls the semiconductor memory device.

* * * * *